United States Patent [19]

Clinkscales

[11] 4,001,709
[45] Jan. 4, 1977

[54] ACTIVE DUAL CHANNEL TUNING CONTROL

[76] Inventor: Matthew Clinkscales, 508 Cleveland St., Brooklyn, N.Y. 11208

[22] Filed: Sept. 30, 1975

[21] Appl. No.: 618,272

[52] U.S. Cl. .............................. 330/30 R; 179/1 G; 330/51; 330/84; 330/124 R
[51] Int. Cl.² ......................................... H03F 3/68
[58] Field of Search ......... 330/30 R, 51, 84, 124 R, 330/126; 179/1 G; 333/28 T; 334/55

[56] References Cited

FOREIGN PATENTS OR APPLICATIONS 1,074,085    1/1960    Germany .................. 330/124 R

*Primary Examiner*—James B. Mullins
*Attorney, Agent, or Firm*—Friedman, Goodman & Teitelbaum

[57] ABSTRACT

An active dual channel tuning control particularly useful for television and stereo applications has two independently adjustable channels. For example, each channel for stereo has an input for receiving a decoded signal which represents the left or right channel information. Each channel additionally has a feedback amplifier with an adjustably turned output to permit highly selective tuning and impedance matching to the following amplification stages. Switching networks are provided for reversing the channel outputs as well as for selectively inhibiting either of the channel outputs in either the normal or reversed channel condition.

10 Claims, 1 Drawing Figure

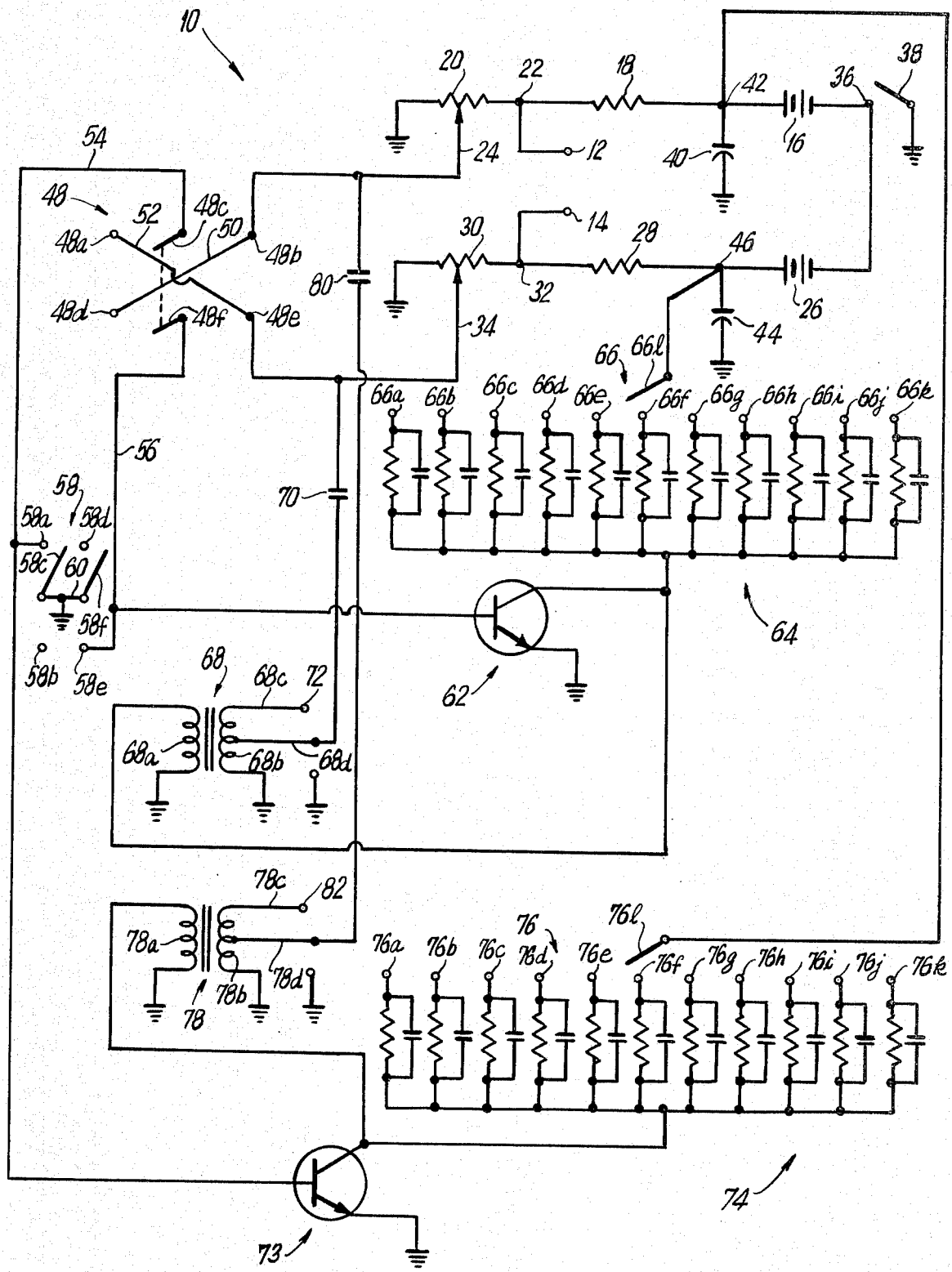

4,001,709

1

ACTIVE DUAL CHANNEL TUNING CONTROL

BACKGROUND OF THE INVENTION

This invention generally relates to tuning circuits, and more specifically to a highly selective dual channel tuning network particularly useful for television and stereo applications.

Tuning circuits for amplifiers are well known. However, these are usually inactive or made of passive elements only. The present invention uses an active tuning circuit for each one of two information channels.

Also, because most prior art tuning circuits do not use feedback amplifiers in the tuning circuits, the tuning responses are generally broad bandwidth and less than totally satisfactory to tune an incoming signal or provide a good impedance match to circuitry that follows.

When tuning is desired of two signals in two separate channels, the prior art circuits do not provide for full flexibility, in a single and economical manner, for reversing the signals between channels and for selectively inhibiting the signals through one or both channels.

SUMMARY OF THE INVENTION

Accordingly, it is an object of the present invention to provide an active dual channel tuning control circuit which does not have the disadvantages of prior art comparable circuits.

It is another object to provide a tuning circuit which is simple in construction and economical to manufacture.

It is still another object to provide a tuning circuit which uses an active element.

It is yet another object to provide a tuning circuit as mentioned above which provides enhanced tuning and impedance matching by utilizing feedback techniques.

It is a further object to provide a tuning circuit for dual channels of information wherein the information may be selectively processed in either of the channels or entirely inhibited from reaching the outputs of the channels.

The above objects, as well as others which will become apparent hereafter, in accordance with the present invention for a dual channel tuning circuit comprises two input terminal means each for receiving a different informational electrical signal. An amplifier is provided at each channel and has an input and an output. Switching means is provided between the input terminal means and the amplifier input for selectively reversing the input terminal means with respect to each of the amplifier inputs and for selectively inhibiting the signals from being applied to the amplifier input. Adjustable impedance means is provided which is associated with each amplifier, and feedback means is utilized between each amplifier output and one of the input terminals for enhancing the tuning and impedance matching to signal processing circuitry that follows when the impedance means is adjusted.

BRIEF DESCRIPTION OF THE DRAWING

With the above and additional objects and advantages in view, as will hereinafter appear, this invention comprises the devices, combinations and arrangements of parts hereinafter described by way of example and illustrated in the accompanying drawing of a preferred embodiment in which:

The single FIGURE is an electrical schematic diagram of the active dual channel tuning control circuit in accordance with the present invention.

DESCRIPTION OF THE PREFERRED EMBODIMENT

Referring now specifically to the single FIGURE, the active dual channel tuning control in accordance with the present invention is generally designated by the reference numeral 10. The tuning control circuit 10 generally is formed of two similar active channels as to be described below. Each channel is suitable for processing an electrical signal and the channels may be reversed and selectively inhibited as will also be more fully described below.

The cirucit 10 has two input terminals 12, 14 each of which is an input for another one of the two channels. A signal may be directly applied to the input terminals 12, 14 in which case the input terminals are floating terminals. Alternately, an input signal may be applied between each of the input terminals and the circuit reference or ground terminal.

The input terminal 12 feeds into a voltage divider circuit formed of a battery 16, a fixed resistor 18 and a potentiometer 20. The input terminal 12 feeds a signal applied thereto to a point 22 where the resistor 18 and the potentiometer 20 join. The other leg of the potentiometer is grounded and the potentiometer has a slider terminal 24 which serves as a volume control, as will become evident hereafter.

Similarly, the input terminal 14 feeds the signal applied thereto to a voltage divider formed of a battery 26, a fixed resistor 28 and a potentiometer 30. Here, the input terminal feeds the signal applied thereto to a point 32 of the voltage divider intermediate the resistor 28 and the potentiometer 30. The potentiometer 30 has a slider terminal 34, movements of which along the potentiometer change the volume of the associated channel, as will become evident hereafter.

The negative terminals of the batteries 16 and 26 are connected to each other and are both connected to a fixed terminal 36 of a single pole switch, the movable contact or terminal 38 of which is grounded as shown. Clearly, when the movable contact 38 does not engage the fixed contact 36, the negative terminals of the batteries 16, 26 are not grounded and each of the above-described voltage divider circuits in each of the channels is open circuited and no currents flow therethrough. Accordingly, there is zero potential applied at each of the slider terminals 24, 34. Upon closing of the on-off switch, when the movable contact 38 38 engages the fixed contact 36, a potential is applied to each of the slider terminals 24, 34, the magnitude of which is the function of both the relative values of the resistors 18 and 28 relative to the values of the potentiometers 20, 30 and the positions of the slider terminals 24, 34.

A filtering capacitor 40 is advantageously applied between the point 42 and ground as well as a filtering capacitor 44 between the point 46 and ground to bypass noise and other transient responses upon the opening and the closing of the on-off switch. The filter capacitors 40, 44 therefore prevent large voltage spikes from appearing at the slider terminals 24, 34, which spikes could damage the circuit, as described below.

The slider terminals 24, 34 are connected to a double-pole double throw switch 48. The switch 48 has one pole having fixed contacts 48a and 48b and movable contact 48c. The other pole has two fixed contacts 48d and 48e and a movable contact 48f. Jumper wires 50 are provided for electrically connecting the fixed contacts 48b and 48d and a jumper 52 for connecting the fixed contacts 48a and 48e. The slider arm 24 is connected to the fixed contact 48b, while the slider terminal 34 is connected to the fixed contact 48e. With the movable contacts 48c and 48f coupled to each other, it should be clear that throwing the switch from one position to the other causes the movable contacts 48c and 48f to be switched between the slider terminals 24 and 34.

The outputs of the switch 48, namely the lead 54 connected to the movable contact 48c, and the lead 56 connected to the movable contact 48f, are connected to a double-pole, three position switch 58. The switch 58 has one pole with fixed contacts 58a and 58b and a movable contact 58c, while the second pole switch has two fixed contacts 58d and 58e and a movable contact 58f. Being a three position switch, the movable contacts can either make contact with one set of fixed contacts, the other set of fixed contacts or be totally disengaged from all the fixed contacts. The movable contacts 58c and 58f are ganged or mechanically coupled to each other as well as being electrically connected by a jumper wire 60 which is connected to ground. With this arrangement, it should be clear that in one position of the switch 58, only one channel is inhibited, in another position of the switch the other channel is inhibited, while in the third position of the switch neither channel is inhibited and therefore both channels are enabled.

The switching circuitry heretofore described is connected to selectively tuned feedback amplifiers, as will now be described. Thus, the fixed contact 58e is connected to the base of a transistor 62, the emitter of which is grounded. In the selector of the transistor 62, there is provided a tank of tuning and biasing elements 64, each of which is connected to a fixed contact of a multiposition rotary switch 66. While eleven tuning and biasing elements are shown in the tank 64, each of the elements being connected to another one of the fixed contacts 66a–66k, it should be clear that any number of such tuning and biasing elements may be utilized consistent with the size of the rotary switch which is available or which is to be used. The rotary switch 66 has a movable contact 66l which is connected to the point 46 of the divider circuit.

Also provided in the selector of the transistor 62 is the transformer output circuit 68 which has a primary coil 68a and a secondary coil 68b. The primary coil 68a has one terminal thereof centrally placed in parallel with one of the tuning and biasing elements in the tank 64 to form a tuned circuit therewith, with the other terminal being connected to a ground potential.

The secondary transformer coil 68b has one terminal thereof 68c which forms an output terminal as to be described, and the other terminal of which is connected to ground potential. A feedback capacitor 70 is provided and connected to an intermediate point 68d of the secondary coil 68b and to the slider terminal 34 at the input of the transistor 62. The output terminal 68c of the secondary winding 68b defines an output terminal of the circuit 10 at the reference numeral 72, when taken between that terminal and the ground potential.

Similarly, an amplifying transistor 73 at the base thereof is connected to the fixed contact 58a, and has the emitter thereof grounded. As with the first described channel, there is provided a tank 74 of tuning and biasing elements in the collector of the transistor 73. Each of the tuning and biasing elements is connected to one of a plurality of fixed contacts 76a–76k of a multiple position rotary switch 76. Here, the movable contact 76l is connected to the point 42 of the first described voltage divider.

Again, as with the first channel, a transformer output is provided, wherein a transformer 78 has an input or primary transformer winding 78a with one terminal in the collector circuit of the transistor 73, and the other terminal is grounded. A secondary transformer coil 78b has one terminal thereof 78c forming an output terminal while the other terminal of the secondary winding is grounded. A feedback capacitor 80 is connected between an intermediate point 78d on the secondary winding 78b and the slider terminal 24 at the input to the transistor 73. The terminal 78c of the winding 78b forms an output terminal 82 at which an output signal may be taken between the terminal and ground.

The values of the resistors and capacitors of each of the tuning and biasing elements shown in the tanks 64, 74 is not in and of itself critical for the purpose of the present invention. The resistor-capacitor combination of each tuning and biasing element, taken together with the output transformer in the collected circuit provides a tuned circuit. Additionally, the values of these features in each of the tuning and biasing elements should be selected so that sufficient collector current is provided to each of the transistors in all positions of the rotary switches. The values of the individual elements in the tuning and biasing elements is not in and of itself critical, where these elements may be selected as desired. Important considerations in the selection of the individual elements include the frequency ranges of each of the channels to be tuned, the impedance levels of the associated circuitry and the loading on the circuit.

The operation of the circuit 10 will now be described. It will initially be assumed that the switch 48 is in the first position to bring into engagement the contacts 48b and 48c, on the one hand, and contacts 48e and 48f on the other hand. Also, it will be assumed that the switch 58 is in a position to disengage the movable contacts 58c and 58f from all the associated fixed contacts thereof. Under these conditions of the switches 48 and 58 and the closure of the on-off switch to ground, the negative terminals of the batteries 16, 26 cause a positive potential to be applied to the bases of the transistors 62, 73. This biases the transistors beyond cutoff and these transistors become amplifying elements.

Since the collector of each transistor is tuned, each transistor amplifier will amplify within a range of frequencies but will reject frequencies which are below or above that frequency range. The output of such a resulting amplification stage, taken at the collector output thereof is fed back into the input or the base of each of these amplifying stages by means of the feedback capacitors 70 and 80. The principles of feedback for purposes of stabilization as well as the shaping of frequency responses is well known to those skilled in the art. In this case, the output frequency response is selectable by changing the positions of the rotary switches in each of the channels, the desired bandwidths being emphasized by utilizing the feedback as aforementioned.

As suggested above, each of the potentiometers 20, 30 serves as a volume control. Firstly, by moving the slider terminals 24, 34 closer to the grounded terminal of the potentiometers, less and less of the input signal applied to the terminals 12, 14 is applied to the respective bases of the transistors 62, 73. Additionally, switch movement toward the grounded terminals by the sliders 24, 34 causes less d.c. biasing potential to be applied to the bases of these transistors to thereby decrease the gain of these amplification stages. For both reasons, continued movement of the terminals 24, 34 toward the grounded terminals of the potentiometers decrease the gain and the overall output signals available at the terminals 72 and 82. Clearly, when the slider terminals 24, 34 are at the points 22, 32 respectively, the entire input signals are applied to the respective bases of the transistors while the optimum d.c. biasing potential is provded by appropriate selection of the values of the fixed resistors in the potentiometers and the divider circuit to provide the optimum gain for the transistors.

As suggested above, it should be clear that throwing the switch 48 to the second position, namely where the movable contacts 48c and 48f are brought into engagement with the fixed contacts 48a and 48b respectively, reverses the connection between the slider terminals 24, 34 and the transistors 62, 73. This effectively reverses these channels so that the input signals applied to the terminals 12, 14 appear reversed at the output 72, 82.

In the position of the switch 58 shown, neither channel is inhibited and signals appear at both output terminals 72, 82. However, by throwing the switch 58 to one position, the contact 58a is grounded. Throwing the switch to the other position, the fixed contact 58e is grounded. In the first case, the channel represented by the transistor 73 becomes disabled since the base of the transistor 73 becomes grounded. In the second case, the second channel represented by the transistor 62 is disabled since the base thereof becomes grounded.

Based on the above, it should be clear that the active dual channel tuning control circuit 10 of the present invention is relatively simple in construction yet provides substantial versatility when used in dual channel circuits or when used in conjunction with stereo circuits having a pair of floating input terminals. For this reason, the circuit 10 is particularly useful for television and stereo applications which has two independently adjustable channels.

When utilized in conjunction with the stereo amplifiers, each input terminal 12, 14 is in the nature of an input terminal for receiving a decoded signal from, for example, a preamplfier-decoding matrix circuit for receiving a decoded signal which represents the left or right channel information. As described above, each channel has a feedback amplifier with an adjustably tuned output to permit highly selective tuning and impedance matching to the following amplification stages. The switches 48 and 58 permit reversing the channel outputs as well as selectively inhibiting either of the channel outputs in either the normal or reversed channel conditions.

It has also been determined that the circuit 10 is very useful for improving television reception. Here, the circuit 10 may be interposed between the television antenna conductors and the antenna terminals on the television receiver. When used in this way, the twin leads of the television cable are connected to the input terminals 12, 14, the electrical signals in the television cables being applied to these terminals in the floating mode when the same are not referenced to ground. The output terminals 72, 82 are similarly connected to the receiver antenna terminals in a similarly floating mode, although improved reception may take place when the circuit ground of the circuit 10 is connected to the chassis ground of the television receiver. Tuning each of the transistors 62 and 73 by rotating the rotary switches 66, 76, provide somewhat different frequency responses for the accompanying signals. Additionally, tuning of the tanks 64, 74 modifies the output impedances at the terminals 72, 82. This has been determined to provide changes in the output of the circuit 10 and, therefore, changes in the impedances at the antenna terminals of the television receiver. In some cases, such changes in circuit output impedance has improved television reception, including elimination of snow, elimination of ghosts or multiple reflections on the line as well as improved color tones.

When utilized in conjunction wth stereophonic signals, it should be clear that the circuit 10 is not only limited to prerecorded material which may be played back on tape recorders or various types of recording equipment, but may also be utilized in conjunction with transmitted stereophonic signals. Whether such transmission is in the nature of an FM radio transmission or whether it may assume transmission of television signals transmitted simultaneously with stereophonic information, this is not in and of itself critical. Clearly, as will be readily evident to those skilled in the art, that any such transmission of stereophonic information must first be decoded in suitable decoding circuitry, well known in the art, and it is the two decoded signals which are in turn applied to each of the input terminals 12, 14 of the present invention for further processing and tuning control.

It should also be evident from those skilled in the art, that the types of transistors 62, 73 used, as well as the nature of the transformers 68, 78 and the values of the elements used in the tanks 64, 74 must all be selected based on the nature of the signals to be processed and, most importantly, on the frequencies of such signals. In accordance with the presently preferred embodiment shown in the FIGURE, the circuit 10 is intended to selectively tune signals in the audio range below approximately 20KHz.

As described in the Background of the Invention, most heretofore known tuning devices such as for television antenna tuning, do not contain active elements as disclosed herein. With the circuit 10, the active amplification stages are provided with positive feedback means for improving the tuning characteristics which are made highly selective, and which provide good impedance matching for subsequent connected circuits. In addition to tuning the incoming signals and impedance matching them to the subsequent circuitry, the circuit of the present invention provides substantial versatility and desired features by permitting reversal of the channels as well as selective inhibition of one or the other of the channels. This is a desirable feature which is not always provided on preamplifiers and amplifiers. Now, with the circuit 10 interposed between, for example, a preamplifier and an amplifier, these desirable features with the aforementioned control over the signal processing are provided.

Numerous alterations of the structure herein disclosed will suggest themselves to those skilled in the art. However, it is to be understood that the present disclosure relates to a preferred embodiment of the invention which is for purposes of illustration only and is not to be construed as a limitation of the invention.

What is claimed is:

1. A dual channel tuning circuit comprising two input terminal means each for receiving a different informational electrical signal; an amplifier provided in each channel and having an input and an output; switching means between said input terminal means and said amplifier inputs for selectively reversing said input terminal means with respect to each of said amplifier inputs and for selectively inhibiting said signals from being applied to said amplifier inputs; adjustable impedance means associated with each amplifier; and feedback means provided between each amplifier output and one of said input terminals for enhancing the tuning and impedance matching to signal processing circuitry that follows when said impedance means is adjusted.

2. A tuning circuit as defined in claim 1, wherein each amplifier comprises a transistor having the base thereof connected to an associated one of said input terminal means and the collector thereof connected to an associated one of said adjustable impedance means.

3. A tuning circuit as defined in claim 1, wherein each adjustable impedance means comprises a plurality of different impedances selectively connectable to an associated amplifier.

4. A tuning circuit as defined in claim 3, wherein each adjustable impedance means includes a multi-pole switch for selectively switching one of said associated impedances into operative tuning portions of an associated amplifier.

5. A tuning circuit as defined in claim 3, wherein said impedances include both reactive and resistive components.

6. A tuning circuit as defined in claim 1, wherein each feedback means comprises a capacitor connected between an associated amplifier output and input.

7. A tuning circuit as defined in claim 1, wherein each channel has a transformer output.

8. A tuning circuit as defined in claim 1, wherein said switching means includes a double-pole, double-throw switch connected to connect said input terminal means to the associated amplifiers in one position of said switch, and to connect said input terminal means to the other than said associated amplifiers in the other position of said switch.

9. A tuning circuit as defined in claim 1, wherein said switching means includes a double-pole, three-position switch connected in each of said channels to permit the application of a signal to only one of said amplifiers in a first position of said switch, to permit the application of a signal only to the other of said amplifiers in a second position of said switch, and to permit the application of signals to both said amplifiers in a third position of said switch.

10. A tuning circuit as defined in claim 1, further comprising volume control means in each of said channels for modifying the magnitudes of said signals at said amplifier output.

* * * * *